United States Patent
Maruyama et al.

(10) Patent No.: US 6,879,540 B2
(45) Date of Patent: Apr. 12, 2005

(54) SYNCHRONOUS SEMICONDUCTOR MEMORY DEVICE HAVING DYNAMIC MEMORY CELLS AND OPERATING METHOD THEREOF

(75) Inventors: Keiji Maruyama, Kawasaki (JP); Shigeo Ohshima, Yokohama (JP); Kazuaki Kawaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 10/370,416

(22) Filed: Feb. 19, 2003

(65) Prior Publication Data

US 2004/0081011 A1 Apr. 29, 2004

(30) Foreign Application Priority Data

Oct. 23, 2002 (JP) ......................................... 2002-308670

(51) Int. Cl.$^7$ ................................................. G11C 8/00
(52) U.S. Cl. ....................... 365/233; 365/191; 365/222; 365/229
(58) Field of Search .............................. 365/233, 191, 365/222, 229

(56) References Cited

U.S. PATENT DOCUMENTS

| 5,777,942 | A | * | 7/1998 | Dosaka et al. ......... 365/230.03 |
| 5,901,101 | A |   | 5/1999 | Suzuki et al. |
| 5,999,481 | A | * | 12/1999 | Cowles et al. ............... 365/233 |
| 6,088,291 | A |   | 7/2000 | Fujioka et al. |
| 6,246,620 | B1 |   | 6/2001 | Fujioka et al. |
| 6,412,048 | B1 | * | 6/2002 | Chauvel et al. .............. 711/158 |
| 6,426,915 | B2 |   | 7/2002 | Ohshima et al. |
| 6,629,224 | B1 | * | 9/2003 | Suzuki et al. ................ 711/167 |
| 2001/0030900 | A1 |   | 10/2001 | Kawaguchi et al. |
| 2002/0149993 | A1 |   | 10/2002 | Oshima et al. |

FOREIGN PATENT DOCUMENTS

EP    0 328 110 A2    8/1989

* cited by examiner

Primary Examiner—Hoai Ho
(74) Attorney, Agent, or Firm—Hogan & Hartson, LLP

(57) ABSTRACT

A synchronous semiconductor memory device includes a memory cell array and a command decoder. In the memory cell array, dynamic memory cells are arranged in a matrix form. The command decoder decodes a plurality of commands in synchronism with an external clock signal. The plurality of commands are set by combinations of logical levels of a plurality of control pins at input timing of a first command and at input timing of a second command one cycle after the input timing of the first command. The command decoder includes a first decode section which determines a read operation, a second decode section which determines a write operation, and a third decode section which determines an auto-refresh operation. Setting of an auto-refresh command is determined only by a combination of the logical levels of the plurality of control pins at the input timing of the first command.

13 Claims, 15 Drawing Sheets

The First Command

| SYMBOL | FUNCTION | /CS | FN | /PD | BA0-BA1 | A14-0 |
|--------|----------|-----|----|----|---------|-------|
| DESEL | Device Deselect | H | x | H | x | x |
| RDA | Read with Auto-close | L | H | H | BA | UA |
| WRA | Write with Auto-close | L | L | H | BA | UA |
| REF | Auto-Refresh | L | L | L | x | x |

The First Command

| SYMBOL | FUNCTION | /CS | FN | BA0-BA1 | A14-0 |
|---|---|---|---|---|---|
| DESEL | Device Deselect | H | x | x | x |
| RDA | Read with Auto-close | L | H | BA | UA |
| WRA | Write with Auto-close | L | L | BA | UA |

FIG. 2A PRIOR ART

The Second Command (The next clock of RDA or WRA command)

| SYMBOL | FUNCTION | /CS | FN | BA0-BA1 | A14-A13 | A12-A8 | A7 | A6-A0 |
|---|---|---|---|---|---|---|---|---|
| LAL | Lower Address Latch | H | x | x | V | x | x | LA |
| REF | Auto-Refresh | L | x | x | x | x | x | x |
| MRS | Mode Register | L | x | V | L | L | V | V |

Notes : L=Logic Low, H=Logic High, x=either L or H, V=Vaild (specified value), BA=Bank Address,
UA=Upper Address, LA=Lower Address

FIG. 2B PRIOR ART

Auto-Refresh Command Table

| FUNCTION | COMMAND (SYMBOL) | CURRENT STATE | /PD n-1 | /PD n | /CS | FN | BA0-BA1 | A14-0 |
|---|---|---|---|---|---|---|---|---|
| Active | WRA (1st) | Standby | H | H | L | L | x | x |
| Auto-Refresh | REF (2nd) | Active | H | H | L | x | x | x |

FIG. 5A PRIOR ART

Self-Refresh Command Table

| FUNCTION | COMMAND (SYMBOL) | CURRENT STATE | /PD n-1 | /PD n | /CS | FN | BA0-BA1 | A14-0 |
|---|---|---|---|---|---|---|---|---|
| Active | WRA (1st) | Standby | H | H | L | L | x | x |
| Self-Refresh Entry | REF (2nd) | Active | H | L | L | x | x | x |
| Self-Refresh Continue | — | Self-Refresh | L | L | x | x | x | x |
| Self-Refresh Exit | SELFX | Self-Refresh | L | H | H | x | x | x |

Notes: L=Logic Low, H=Logic High, x=either L or H

FIG. 5B PRIOR ART

The First Command

| SYMBOL | FUNCTION | /CS | FN | /PD | BA0-BA1 | A14-0 |
|---|---|---|---|---|---|---|
| DESEL | Device Deselect | H | x | H | x | x |
| RDA | Read with Auto-close | L | H | H | BA | UA |
| WRA | Write with Auto-close | L | L | H | BA | UA |
| REF | Auto-Refresh | L | L | L | x | x |

FIG. 7A

The Second Command (The next clock of RDA or WRA command)

| SYMBOL | FUNCTION | /CS | FN | BA0-BA1 | A14-A13 | A12-A8 | A7 | A6-A0 |
|---|---|---|---|---|---|---|---|---|
| LAL | Lower Address Latch | H | x | x | V | x | x | LA |
| MRS | Mode Register | L | x | V | V | L | V | V |

FIG. 7B

Self-Refresh Command Table

| FUNCTION | COMMAND (SYMBOL) | CURRENT STATE | /PD n-1 | /PD n | /CS | FN | BA0-BA1 | A13-0 |
|---|---|---|---|---|---|---|---|---|
| Active | REF (1st) | Standby | H | L | L | L | x | x |
| Self-Refresh Entry | REF (2nd) | Active | L | L | x | x | x | x |
| Self-Refresh Continue | — | Self-Refresh | L | L | x | x | x | x |
| Self-Refresh Exit | SELFX | Self-Refresh | L | H | H | x | x | x |

Notes: L=Logic Low, H=Logic High, x=either L or H, V=Valid(specified value), BA=Bank Address, UA=Upper Address, LA=Lower Address

FIG. 7C

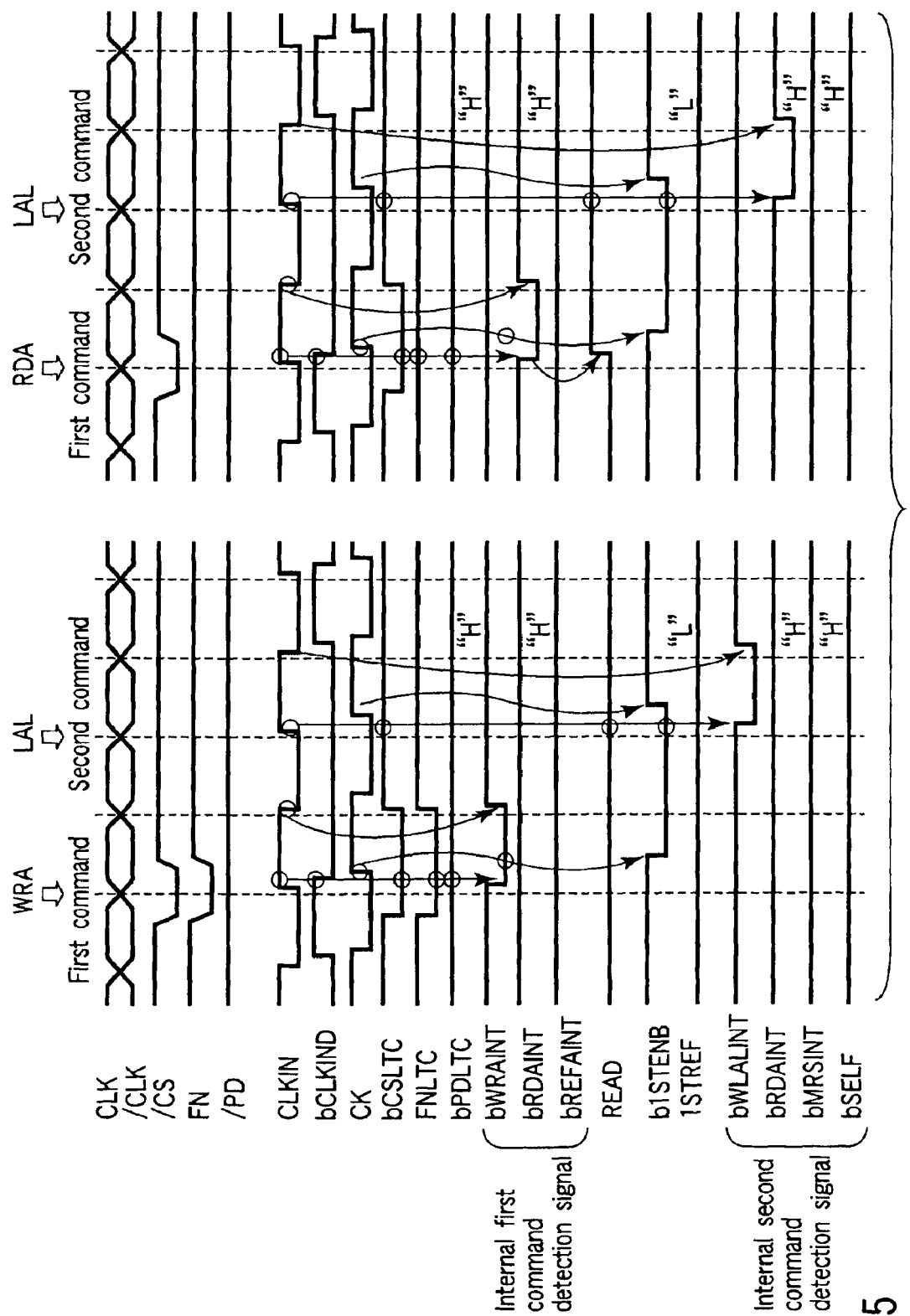
F I G. 15

SYNCHRONOUS SEMICONDUCTOR MEMORY DEVICE HAVING DYNAMIC MEMORY CELLS AND OPERATING METHOD THEREOF

CROSS-REFERENCE TO RELATED APPLICATIONS

This application is based upon and claims the benefit of priority from the prior Japanese Patent Application No.2002-308670, filed Oct. 23, 2002, the entire contents of which are incorporated herein by reference.

BACKGROUND OF THE INVENTION

1. Field of the Invention

This invention relates to a synchronous semiconductor device. More particularly, this invention relates to a synchronous semiconductor memory device which is provided with dynamic memory cells requiring the refresh operation and is operated in synchronism with an external clock signal and an operating method thereof. For example, this invention can be applied to a fast cycle synchronous DRAM (SDR-FCRAM), double data rate synchronous DRAM (DDR-FCRAM) having the data transfer rate which is twice that of the former device and the like.

2. Description of the Related Art

In the conventional SDRAM (Synchronous Dynamic Random Access Memory), the memory cell array is divided into a plurality of banks and successively performs the data read/write operations in synchronism with a clock signal from the exterior while switching the banks. In recent years, a memory which is designed to attain the high-speed data rate, for example, a double data rate DDR-SDRAM designed to achieve the data transfer rate which is twice that of the above device becomes dominant. However, in an application in which random cycle time is important as in a network system or the like, it is necessary to enhance the operation speed of the bank itself.

The above problem can be solved by use of the DDR-FCRAM (Fast Cycle Random Access Memory). Like the DDR-SDRAM, in the DDR-FCRAM, the memory cell array is divided into a plurality of banks. In this case, the data read/write operations can be successively performed in synchronism with an external clock signal and data can be transferred at high speed of double data rate. In addition to the above feature, random cycle time can be shortened by improving the operation of accessing to the memory cell array and using a new write system. Therefore, the device has received much attention in the application of the network system or the like. However, the DRAM cell requires the refresh operation. Therefore, in order to further enhance the application efficiency of the bus in the entire system, it becomes important to shorten the refresh cycle time and reduce disturb time due to the refresh operation.

Next, the operation of the FCRAM is schematically explained with reference to FIGS. 1, 2A, 2B and 3. FIG. 1 is a state transition diagram of the FCRAM, FIGS. 2A and 2B are command tables and FIG. 3 is a timing chart of each command. As shown in FIGS. 2A, 2B and 3, the command system of the FCRAM is set up by a combination of a first command and a second command. The command is controlled according to the levels of two pins including a chip select pin (chip select signal /CS) and a function pin (function signal FN). Thus, a large number of commands can be determined by use of a small number of control pins by determining a command according to a combination of the levels of the control pins (chip select pin and function pin) at input timing of the first command and the levels of the above control pins at input timing of the second command.

As shown in the command table of FIG. 2A, for example, the first command is a read active command RDA and write active command WRA. As shown in the command table of FIG. 2B, the second command is a lower address latch command LAL, auto-refresh command REF and mode register command MRS.

As shown in the state transition diagram of FIG. 1, for example, the read operation (READ) is performed as follows. In the standby state (STANDBY), first, the chip select signal /CS is set to the "L" level and the function signal is set to the "H" level at the input timing of the first command to set a read active command RDA (Read with Auto-close). Then, an upper address UA used to select a column and a bank address BA used to select a bank are input. Next, the chip select signal /CS is set to the "H" level at the input timing of the second command one clock (tCK) after the input timing of the first command. Then, a column address latch command LAL (Lower Address Latch) which latches a row address is set and a lower address LA which selects a row is input. After this, the state is automatically returned to the standby state and the read operation is terminated.

The write operation (WRITE) is performed by setting a write active command WRA (Write with Auto-close) in which only the logical level of the function signal FN is different in comparison with that used in the case of the read operation as the first command and inputting an upper address UA and bank address BA. Then, a column address latch command LAL is set by setting the chip select signal /CS to the "H" level at the input timing of the second command one clock after the input timing of the first command and a lower address LA is input. After this, the state is automatically returned to the standby state and the write operation is terminated.

In the operation of the FCRAM internal portion, as shown in the block diagram of FIG. 4, an internal command decoder 100 detects the read operation and supplies a detection signal to a control logic 101 when a read active command RDA is received at the input timing of the first command. The control logic 101 determines the operation timing of the internal circuit according to information such as latency of the write/read operation from a mode register 102 and outputs a control signal CS. A bank address and upper address received at this time are fetched by an address receiver 103 which logically converts the received address levels. Then, an upper address latch 104 is controlled by the control signal CS output from the control logic 101 to select one of banks A, B, C, D, ... and a word line WL and read out cell data. After the cell data is read out, the operation of transferring charges (information) written into the cell to the bit line and amplifying the data by use of a bit line sense amplifier is performed.

When a lower address latch command LAL is received as the second command, a lower address LA which is a column address received at this time is logically converted by the address receiver 103 and a lower address output therefrom is latched by a lower address latch 105 which in turn generates an internal Y address. Further, a column decoder 106 selects a column selection line CSL to transfer data on the bit line to a data line. Then, data is logically determined by a second sense amplifier 107 and temporarily held in a data latch control 108. A burst counter 109 and sync. circuit 110 are used to control output timing of burst data and operation timing of an output buffer (input/output buffer 111) and data is output to the exterior according to the read latency.

In this case, since the DRAM cell is a destructive read type cell, the charge is rewritten into the cell by use of the bit line sense amplifier even after the column select line CSL is set into the non-selected state. After this, the word line WL is reset by use of a bank timer which controls the operation of the bank set in the internal portion, the operation is automatically returned to the bit line precharge operation and the state is set to the standby state.

As to the FCRAM write operation, the applicant of this invention proposed a data write system of "Delayed Write" system (which is hereinafter referred to as a Late Write system) in "Semiconductor Memory Device" of Jpn. Pat. Appln. KOKAI Publication No. P2000-137983. In the data write system, a system of temporarily holding a received address and write data and writing data into a cell in a next cycle by use of the address and write data received in the preceding cycle is used in order to shorten random cycle time tRC. Thus, the random cycle time is shortened. If the late write system is not used, it is necessary to operate the column select line CSL and perform the write operation with respect to the cell after receiving write data of one burst and it becomes impossible to shorten the random cycle time tRC.

Next, the internal operation in the write cycle of the FCRAM is explained. When a write active command WRA is received as the first command, the command decoder 100 detects the write operation and outputs a detection signal to the control logic 101. The control logic 101 determines the operation timing of the internal circuit according to information such as write/read latency from the mode register 102 and issues a control signal CS. Further, a bank address BA and upper address UA supplied at this time are fetched and the levels of the fetched addresses are logically converted by the address receiver 103. Then, the upper address latch 104 temporarily holds the logically converted address and outputs upper address information held in the preceding write cycle as an internal X address to select one of the banks A, B, C, D, . . . and a word line WL.

When a column address latch command LAL is received as the second command, a lower address LA which is a column address supplied at this time is logically converted by the address receiver 103. Then, the lower address is temporarily held in the lower address latch 105 which in turn outputs a lower address LA held in the preceding write cycle as an internal Y address to the column decoder 106. Thus, the column decoder 106 selects a column select line CSL. Further, the operation of temporarily holding write data received by the data latch control section 108 and the operation of writing data into the cell are performed. The operation of writing data into the cell is performed by outputting write data held in the preceding write cycle to the data line, supplying the data to the bit line via the column select line CSL and writing the data into the cell by use of the bit line sense amplifier. After this, the word line WL is reset by use of the bank timer set in the internal portion and the operation is automatically returned to the bit line precharge operation.

As described above, the late write system is to temporarily hold an address and write data received in the write cycle in the latch circuit section and perform the write operation into the cell in a next cycle by use of the thus held address and write data. As a result, the random cycle time can be shortened.

So far, the read or write operation in which the first command is the read active command RDA or write active command WRA and the second command is the lower address latch command LAL has been described.

However, as described above, in a case where the chip select signal /CS is set at the "L" level, an auto-refresh command REF and mode register command MRS are provided as the second command other than the lower address latch command LAL. Since the mode register command MRS is not directly associated with the present invention, the detail explanation thereof is omitted and the auto-refresh command REF which is directly associated with the present invention is explained in detail.

As shown in the command table of FIG. 5A, the auto-refresh operation (AUTO-REFRESH) can be performed when the write active command WRA which is used as the first command and the auto-refresh command REF which is used as the second command are combined. That is, the auto-refresh operation can be performed by inputting the write active command WRA as the first command like the case of the write operation and the auto-refresh command REF which is different from the case of the write operation as the second command. In this case, since the write active command WRA is input in each case of the write operation and the auto-refresh operation as the first command, it is impossible to determine whether the operation is the write operation or the auto-refresh operation simply by receiving the first command. Further, if the write operation is started after the second command is received, start of the operation is delayed by one cycle so that shortening of the random cycle time which is the feature of the FCRAM will be obstructed. Therefore, in order not to obstruct shortening of the random cycle time, the system is designed to first perform the write operation even in the auto-refresh operation and then start the actual auto-refresh operation after the end of the above write operation.

Next, the auto-refresh operation is explained with reference to the timing chart of FIG. 6. FIG. 6 is a timing chart in a case where the auto-refresh operation is performed after the write operation and a case wherein the read latency CL is "4" and the burst length BL is "4" is shown as an example. First, in order to enter into the write operation, a write active command WRA, bank address BA and upper address UA are input as the first command at the timing at which an external clock signal is set at "0". Then, a lower address latch command LAL and lower address LA are input as the second command at timing one clock after the above timing. Since the write latency is equal to "(read latency) −1", the input timing of write data is so set that data items D0 to D3 with the burst length of "4" will be input at the double data rate in synchronism with both of the leading and trailing edges of the external clock signal three cycles after input of the second command.

As described above, in the write operation of the FCRAM, the received address and write data are temporarily held in the internal latch circuit section. In the write operation, the late write operation of writing data into the cell by use of the address and write data which are actually received in the preceding cycle and temporarily held in the latch circuit section is performed. That is, a word line WLa and column select line CSa are selected by use of the address received in the preceding write operation and the late write operation of writing write data received in the write operation in the preceding cycle into the cell selected by the above lines is performed. After this, the word line WL is reset by use of the bank timer set in the internal portion, the operation is automatically returned to the bit line precharge operation and the state is set to the standby state.

In the above example, the random cycle time tRC is set equal to five clocks of the clock cycle time tCK. Since it is permitted to input the auto-refresh command after lapse of the random cycle time tRC, the write active command WRA is input at timing at which five clocks of the external clock signal have elapsed and the auto-refresh command REF is input when next one clock has elapsed.

As described before, in the conventional FCRAM, the write operation is first performed even in the auto-refresh operation. Then, the late write operation of an address and write data received in the write operation in the preceding cycle is first performed in the auto-refresh operation. A word line WLb and column select line CSLb are selected in the write operation. After this, the word line WL is automatically reset by use of the bank timer, the operation is automatically returned to the bit line precharge operation and the write operation is terminated. Next, a word line WLc is selected by use of a refresh address counter which counts up for each refresh operation. Then, the refresh operation period is controlled by a refresh timer which controls the refresh operation period and the state is automatically returned to the standby state.

The operation enters into the self-refresh operation (SELF-REFRESH) shown in FIG. 5B by inputting the same auto-refresh command REF as the second command in the auto-refresh operation and setting a power down signal /PD to the "L" level. The self-refresh operation basically follows after the auto-refresh operation and automatically continues the refresh operation according to the period of a self-refresh timer set in the internal portion.

As described before, auto-refresh cycle time tREFC as viewed from the exterior is determined by the sum of the first late write operation time and the actual refresh operation time. Therefore, the auto-refresh cycle time tREFC in the conventional FCRAM becomes longer by the time of the late write operation.

In the auto-refresh command system in the conventional synchronous semiconductor memory device and the operating method thereof, the first command (write active command WRA) which is the same as that used in the write operation is used and the second command (auto-refresh command REF) which is different from that used in the write operation is input. Therefore, since the write active command WRA is input as the first command in both cases of the write operation and auto-refresh operation, it is impossible to determine whether the operation is the write operation or the auto-refresh operation simply by receiving the first command.

Thus, in the auto-refresh operation, the refresh operation is performed after the write operation is first performed and there occurs a problem that shortening of the auto-refresh cycle time is obstructed.

Further, if the write operation is started after the second command is received, start of the operation is delayed by one cycle and there occurs a problem that shortening of the random cycle time which is the feature of the FCRAM is obstructed.

BRIEF SUMMARY OF THE INVENTION

A synchronous semiconductor memory device according to an aspect of the invention comprises a memory cell array having dynamic memory cells arranged in a matrix form, and a command decoder configured to decode a plurality of commands in synchronism with an external clock signal, the plurality of commands being set by combinations of logical levels of a plurality of control pins at input timing of a first command and at input timing of a second command one cycle after the input timing of the first command, the plurality of control pins including a chip select pin, a function pin and a power down pin, and the command decoder including a first decode section which determines a read operation, a second decode section which determines a write operation, and a third decode section which determines an auto-refresh operation, wherein setting of an auto-refresh command is performed at the input timing of the first command and determined only by a combination of the logical levels of the chip select pin, function pin and power down pin at the input timing of the first command.

An operating method of a synchronous semiconductor memory device according to another aspect of the invention which includes a memory cell array having dynamic memory cells arranged in a matrix form and is operated in synchronism with an external clock signal and in which a plurality of commands are set by combinations of logical levels of a chip select pin, a function pin and a power down pin at input timing of a first command and at input timing of a second command one cycle after the input timing of the first command, the synchronous semiconductor memory device further including first and second command decoders configured to decode the plurality of commands in synchronism with the external clock signal, wherein the plurality of commands are set by combinations of the the chip select pin, the function pin and the power down pin at the input timing of the first command and at the input timing of the second command one cycle after the input timing of the first command, and setting of an auto-refresh command is determined only by a combination of the logical levels of the chip select pin, the function pin and the power down pin at the input timing of the first command, the first command decoder including a first decode section which determines a read operation, a second decode section which determines a write operation, and a third decode section which determines an auto-refresh operation, the second command decoder including a fourth decode section which detects that the first command is a write active command and the second command is a lower address latch command, a fifth decode section which detects that the first command is a read active command and the second command is a lower address latch command, a sixth decode section which detects that the first command is a read active command and the second command is a mode register command, and a seventh decode section which detects that the first command is an auto-refresh command and the second command is a self-refresh command, the operating method comprising: setting an auto-refresh command by the combination of the logical levels of the chip select pin, the function pin and the power down pin at the input timing of the first command, and setting a self-refresh command by a different combination of the logical levels of the chip select pin, the function pin and the power down pin at the input timing of the second command.

BRIEF DESCRIPTION OF THE SEVERAL VIEWS OF THE DRAWING

FIG. 2A is a command table of a first command, for illustrating the conventional synchronous semiconductor memory device and an operating method thereof, FIG. 2B is a command table of a second command, for illustrating the conventional synchronous semiconductor memory device and an operating method thereof, FIG. 5A is a command table of an auto-refresh operation, for illustrating the conventional synchronous semiconductor memory device and an operating method thereof, FIG. 5B is a command table of a self-refresh operation, for illustrating the conventional synchronous semiconductor memory device and an operating method thereof, FIG. 7A is a command table of a first command, for illustrating a synchronous semiconductor memory device according to an embodiment of the present invention and an operating method thereof, FIG. 7B is a command table of a second command, for illustrating the synchronous semiconductor memory device according to the embodiment of the present invention and the operating method thereof, FIG. 7C is a command table of a self-refresh command, for illustrating the synchronous semiconductor memory device according to the embodiment of the present invention and the operating method thereof, FIG. 15 is a timing chart of the write operation and read operation, for illustrating the synchronous semiconductor memory device according to the embodiment of the present invention and the operating method thereof.

DETAILED DESCRIPTION OF THE INVENTION

Since the conventional auto-refresh command system is a system which determines the operation mode in response to input of the second command, whether the operation is the write operation or the auto-refresh operation cannot be determined until the second command is input. Therefore, in the embodiments of the present invention, the command system is reexamined so that an auto-refresh command will be accepted when the first command is input and the write operation is inhibited from being performed in the auto-refresh operation.

That is, the embodiments of the present invention is characterized in that determination of the auto-refresh command is made according to only input of the first command in a synchronous semiconductor memory device which includes a memory cell array having dynamic memory cells arranged in a matrix form and sets a plurality of commands based on a plurality of command control signals by use of combinations of logical levels of input of the first command and input of the second command input one cycle after input of the first command in synchronism with an external clock signal.

As a result, the auto-refresh operation can be determined at the input timing of the first command and whether the conventional write operation is performed or not can be determined. Thus, since the auto-refresh operation can be started in response to input of the first command, the auto-refresh cycle time can be shortened and the application efficiency of the bus can be enhanced.

Next, the configuration and operating method of a concrete synchronous semiconductor memory device to realize the present invention as described above are explained by referring to an embodiment.

Figure 8:
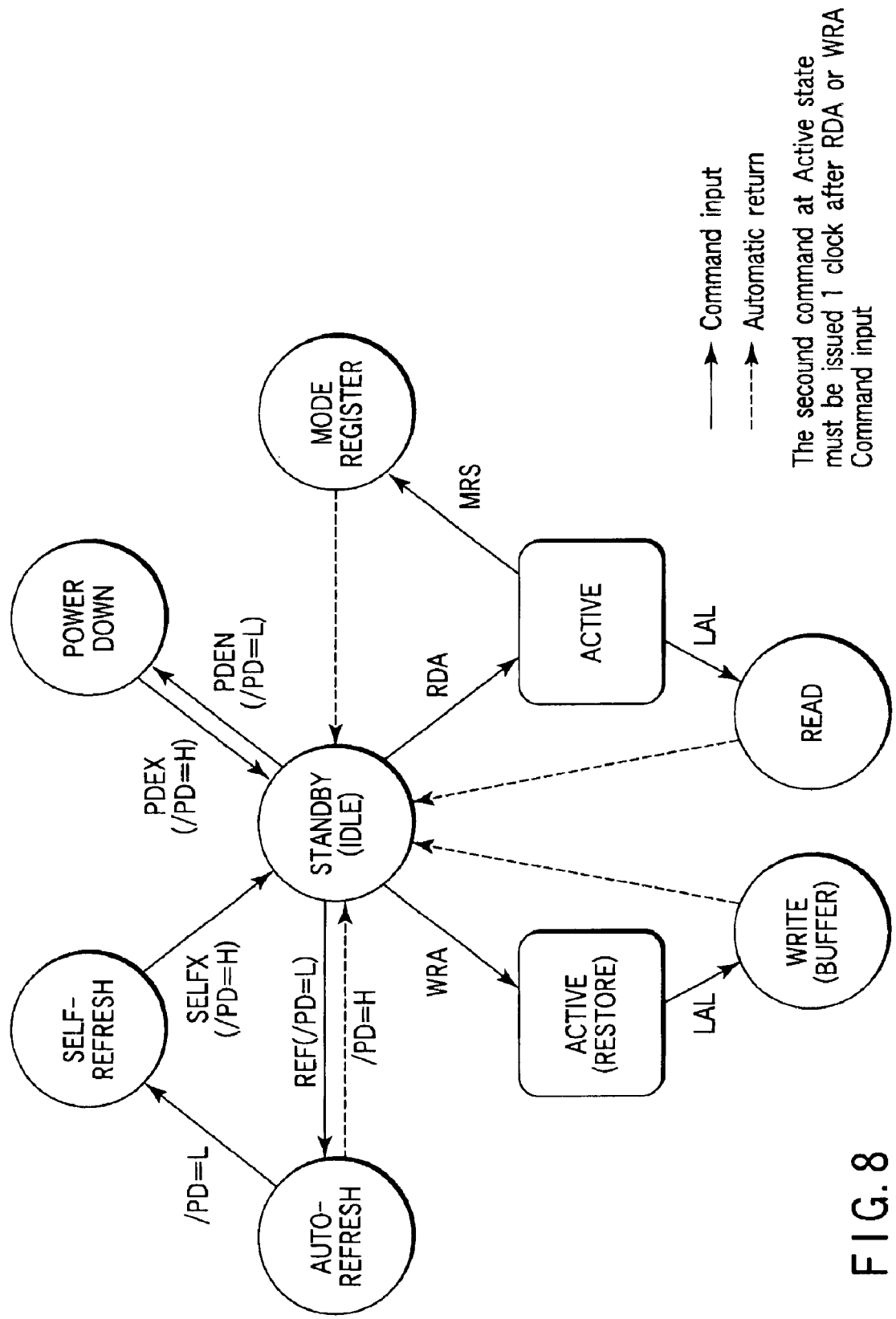
FIG. 8 is a state transition diagram of each command, for illustrating the synchronous semiconductor memory device according to the embodiment of the present invention and the operating method thereof.

FIGS. 7A, 7B and 7C are command system diagrams of a synchronous semiconductor memory device according to the embodiment of the present invention. FIG. 7A is a command table of a first command, FIG. 7B is a command table of a second command, and FIG. 7C is a command table of a self-refresh command. FIG. 8 is a state transition diagram of each command. As is clearly understood by comparison with the command tables of FIGS. 2A and 2B, the command system of the synchronous semiconductor memory device according to the embodiment of the present invention is made such that the systems of the auto-refresh command REF and self-refresh command are different from each other.

That is, the auto-refresh command REF is determined by setting a chip select pin (chip select signal /CS), function pin (function signal FN) and power down pin (power down signal /PD) to the logical level of "L" level at the input timing of the first command. On the other hand, the self-refresh command is determined by maintaining the power down signal /PD at the "L" level at the input timing of the second command.

Thus, by reexamining the command system, the auto-refresh operation is started by detecting the auto-refresh command REF when the auto-refresh command REF is input at the input timing of the first command in the standby state as shown in the state transition diagram of FIG. 8. Then, if it is detected that the power down signal /PD is at the "H" level when the second command is input, the self-refresh command is not determined, the state is automatically returned to the standby state by use of a refresh timer previously provided in the internal portion and the auto-refresh operation is terminated. If it is detected that the power down signal /PD is at the "L" level when the second command is input, the self-refresh command is determined and the self-refresh operation is performed after the auto-refresh operation is terminated. In the self-refresh operation, the refresh operation is continuously performed according to a period set by a self-refresh timer previously provided in the internal portion.

Figure 1:
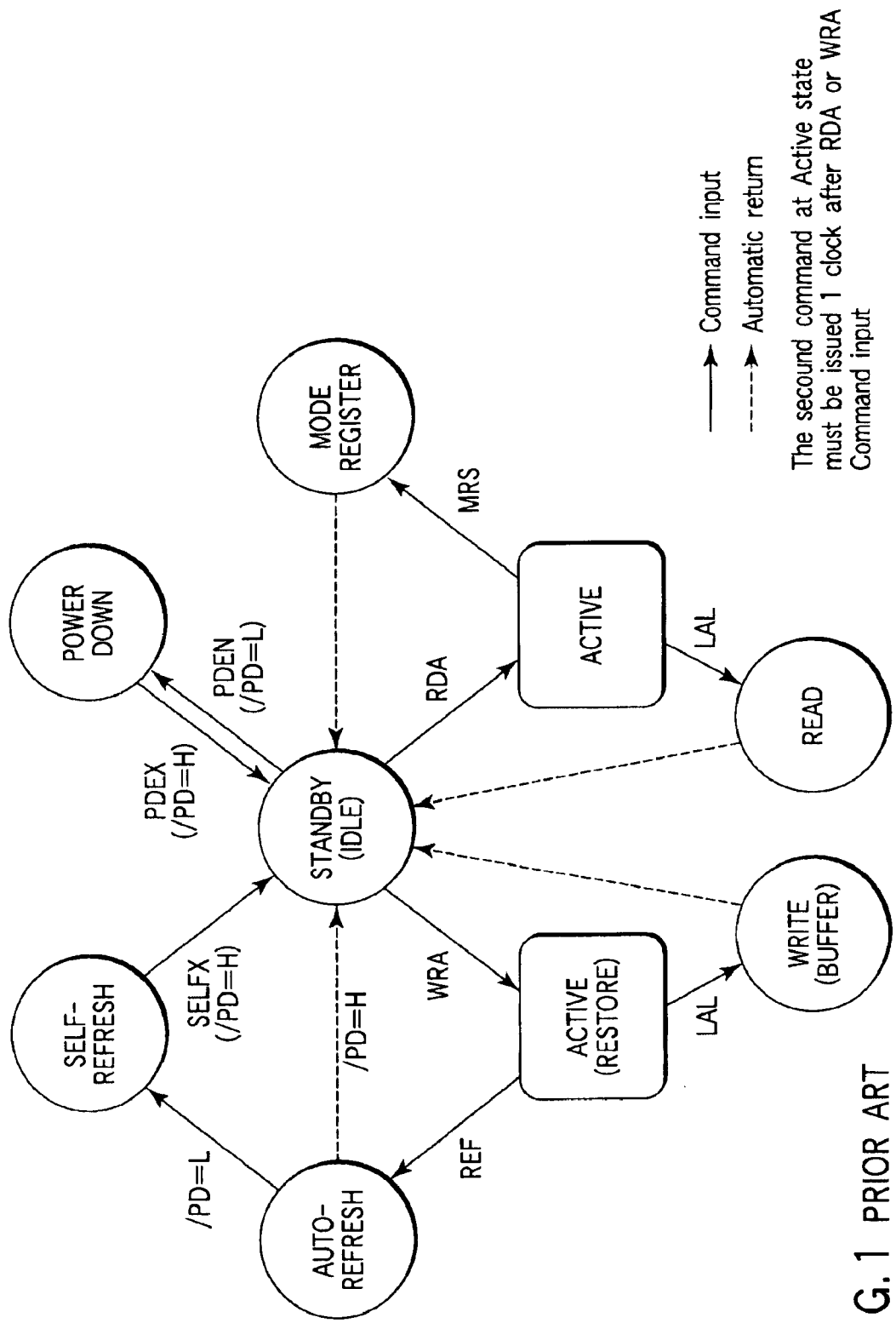
FIG. 1 is a state transition diagram of an FCRAM, for illustrating the conventional synchronous semiconductor memory device and an operating method thereof.
Figure 3:
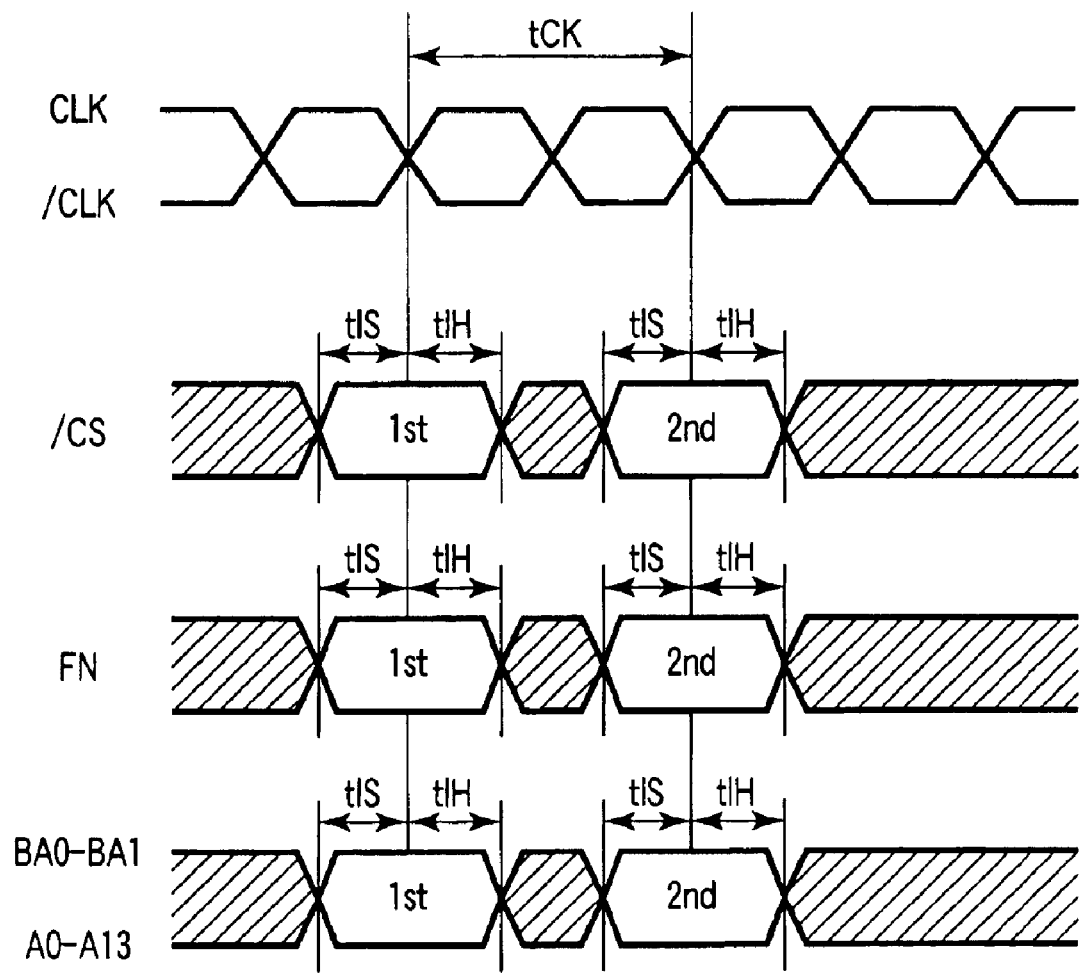
FIG. 3 is a timing chart of each command, for illustrating the conventional synchronous semiconductor memory device and an operating method thereof.
Figure 4:
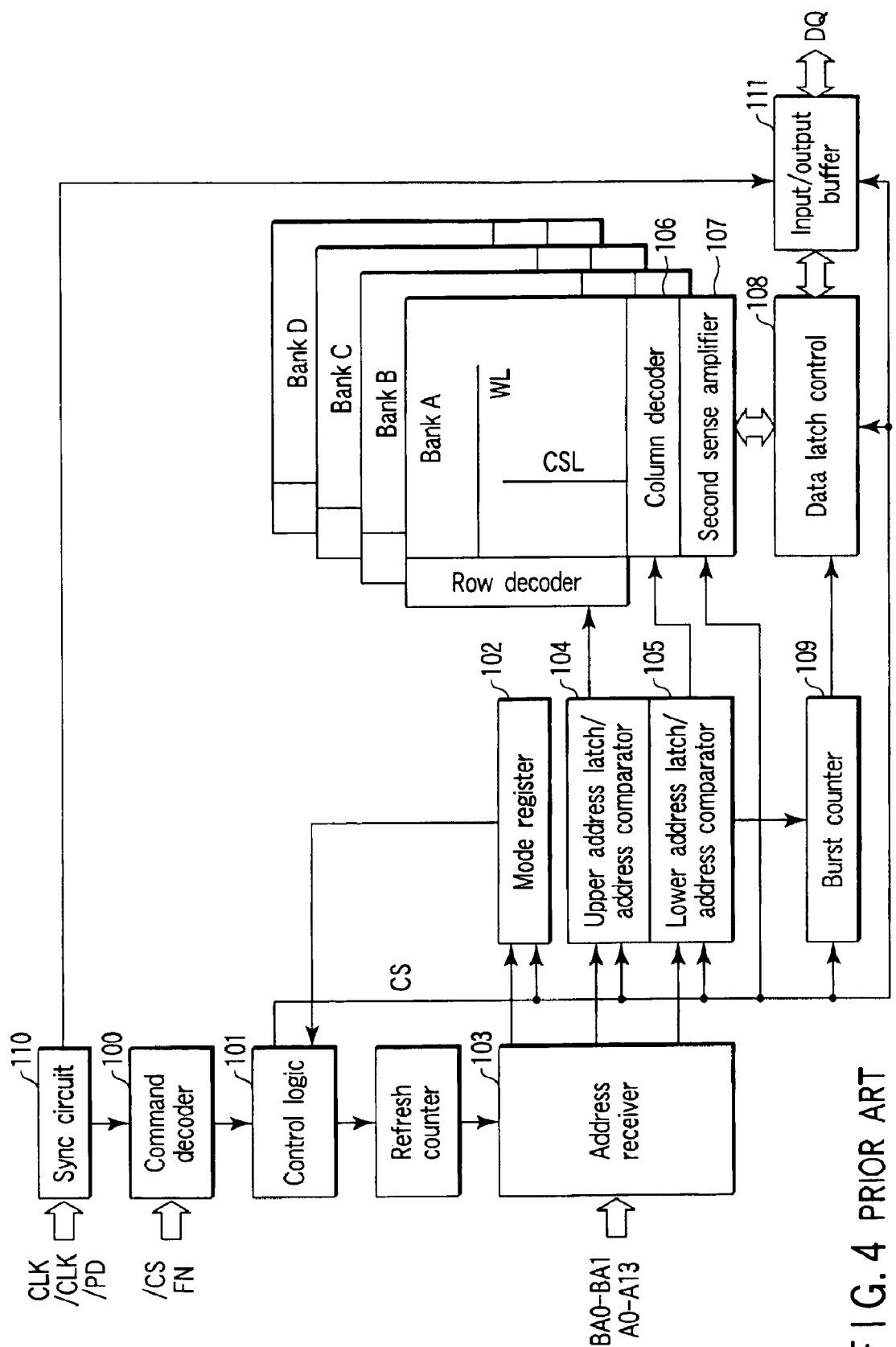
FIG. 4 is a block diagram of an extracted main portion, for illustrating the conventional synchronous semiconductor memory device and an operating method thereof.
Figure 6:
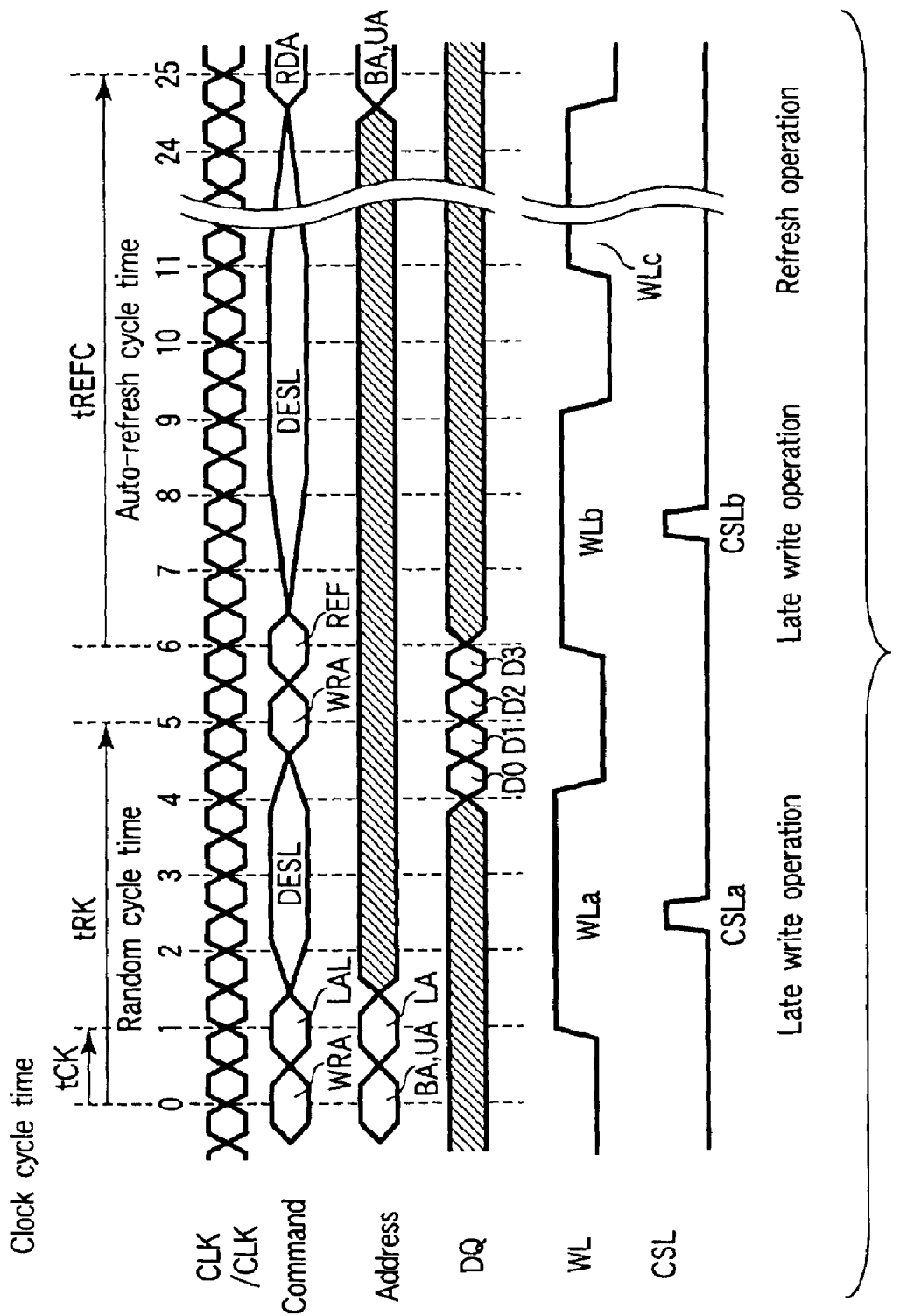
FIG. 6 is a timing chart in a case where the auto-refresh operation is performed after the write operation is performed, for illustrating the conventional synchronous semiconductor memory device and an operating method thereof.
Figure 9:
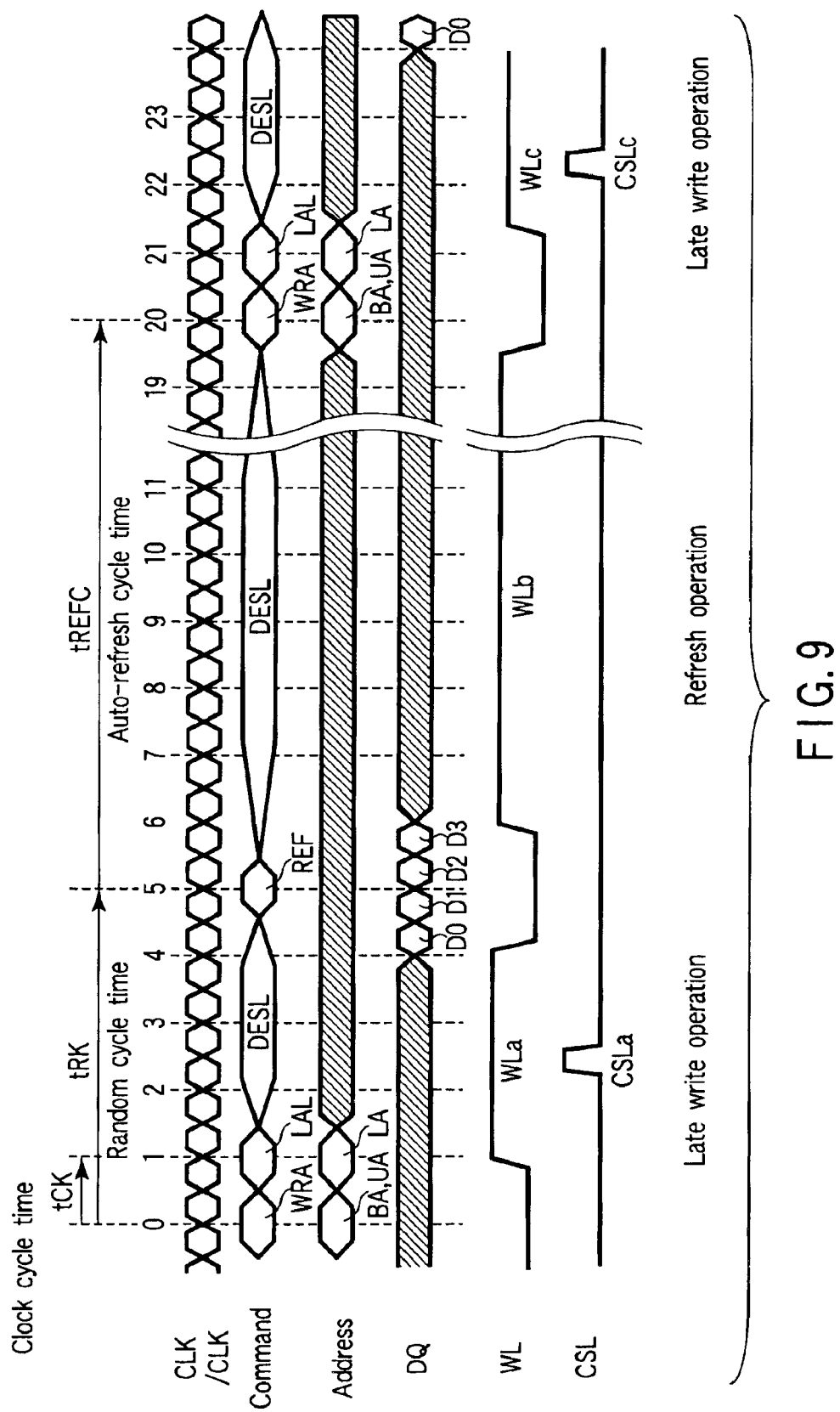
FIG. 9 is a timing chart in a case where the auto-refresh operation is performed after the write operation is performed, for illustrating the synchronous semiconductor memory device according to the embodiment of the present invention and the operating method thereof.

FIG. 9 shows the operating method of the synchronous semiconductor memory device according to the embodiment of the present invention in comparison with the operating method shown by the timing chart of FIG. 6. In this case, the timing chart in a case where the read latency CL is "4", the burst length BL is "4" and the auto-refresh operation is performed after the is write operation is shown. In order to determine the write operation like the conventional case, a write active command WRA is set at input timing of the first command and a lower address latch command LAL is set at input timing of the second command.

The write operation of the FCRAM internal portion is performed based on a late write system in which the write operation with respect to the memory cell is performed by use of an address and write data received in the write operation in the preceding cycle by a holding circuit section. Then, the state is automatically returned to the standby state by use of a bank timer previously provided in the internal portion and the write operation is terminated. After this, the auto-refresh command REF is input, and if the auto-refresh command REF is determined, the refresh operation is instantly started. Then, the potential of a selected word line WLb is raised by use of a refresh address counter previously set in the internal portion to refresh the memory cell. After this, the potential of the selected word line WLb is lowered by use of a refresh timer previously set in the internal portion to control the refresh operation period, the operation is set to the precharge operation, the state is automatically returned to the standby state and the auto-refresh command is ended.

As described above, whether the operation is the write operation or the auto-refresh operation can be determined at the input timing of the first command by reexamining the command system so as to determine the auto-refresh command at the input timing of the first command. As a result, the auto-refresh cycle time can be easily shortened.

Next, an example of the configuration of the command decoder to realize the above refresh command system is explained in detail.

Figure 10:
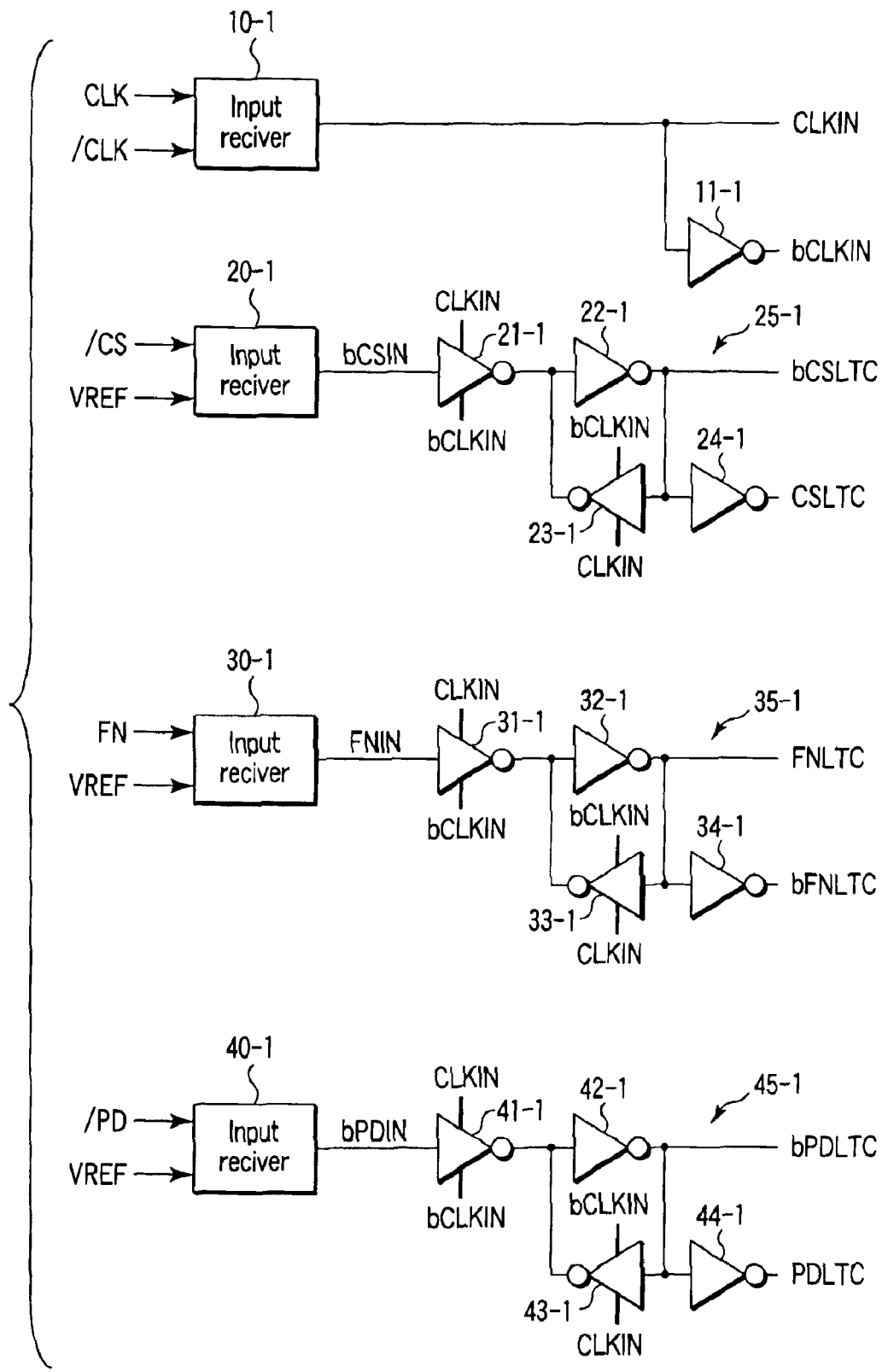
FIG. 10 is a circuit diagram showing an external pin logic determination circuit, for illustrating the synchronous semiconductor memory device according to the embodiment of the present invention and the operating method thereof.

FIG. 10 shows an external pin logic determination circuit configured by an input receiver which logically determines the input level of each control pin and a latch circuit which latches a signal received by the input receiver. As shown in FIG. 10, external clock signals CLK, /CLK input to the external clock pins are input to an input receiver 10-1. The voltage level of each of the external clock signals CLK, /CLK is logically converted by the input receiver 10-1 and output as an internal clock signal CLKIN. Further, the output signal of the input receiver 10-1 is inverted by an inverter 11-1 and output as an internal clock signal bCLKIN.

A chip select signal /CS input to a chip select pin and reference voltage VREF input to a logical level determination reference pin are input to an input receiver 20-1. The input receiver 20-1 compares the voltage levels of the chip select signal /CS and reference voltage VREF to make a logical determination and outputs an internal signal bCSIN. The internal signal bCSIN output from the input receiver 20-1 is input to a latch circuit 25-1. The latch circuit 25-1 is configured by clocked inverters 21-1, 23-1 whose operations are controlled by the internal clock signals CLKIN, bCLKIN and inverters 22-1, 24-1. The latch circuit 25-1 latches the state of the internal signal bCSIN in synchronism with a leading edge of the external clock signal and outputs a latch determination signal bCSLTC as an output signal from the inverter 22-1. Further, an inverted signal CSLTC of the signal bCSLTC is output from the inverter 24-1.

In the case of the function pin and power down pin, the same circuit configuration as in the case of the chip select pin is obtained and the basic operation thereof is the same.

That is, a function signal FN input to the function pin and reference voltage VREF input to a logical level determination reference pin are input to an input receiver 30-1. The input receiver 30-1 compares the voltage levels of the function signal FN and reference voltage VREF to make a logical determination and outputs an internal signal FNIN. The internal signal FNIN output from the input receiver 30-1 is input to a latch circuit 35-1. The latch circuit 35-1 is configured by clocked inverters 31-1, 33-1 whose operations are controlled by the internal clock signals CLKIN, bCLKIN and inverters 32-1, 34-1. The latch circuit 35-1 latches the state of the internal signal FNIN in synchronism with a leading edge of the external clock signal, outputs a latch determination signal FNLTC as an output signal from the inverter 32-1 and outputs an inverted signal bFNLTC of the signal FNLTC from the inverter 34-1.

Further, a power down signal /PD input to the power down pin and reference voltage VREF input to a logical level determination reference pin are input to an input receiver 40-1. The input receiver 40-1 compares the voltage levels of the power down signal /PD and reference voltage VREF to make a logical determination and outputs an internal signal bPDIN. The internal signal bPDIN output from the input receiver 40-1 is input to a latch circuit 45-1. The latch circuit 45-1 is configured by clocked inverters 41-1, 43-1 whose operations are controlled by the internal clock signals CLKIN, bCLKIN and inverters 42-1, 44-1. The latch circuit 45-1 latches the state of the internal signal bPDIN in synchronism with a leading edge of the external clock signal, outputs a latch determination signal bPDLTC as an output signal from the inverter 42-1 and outputs an inverted signal PDLTC of the signal bPDLTC from the inverter 44-1.

Figure 11:
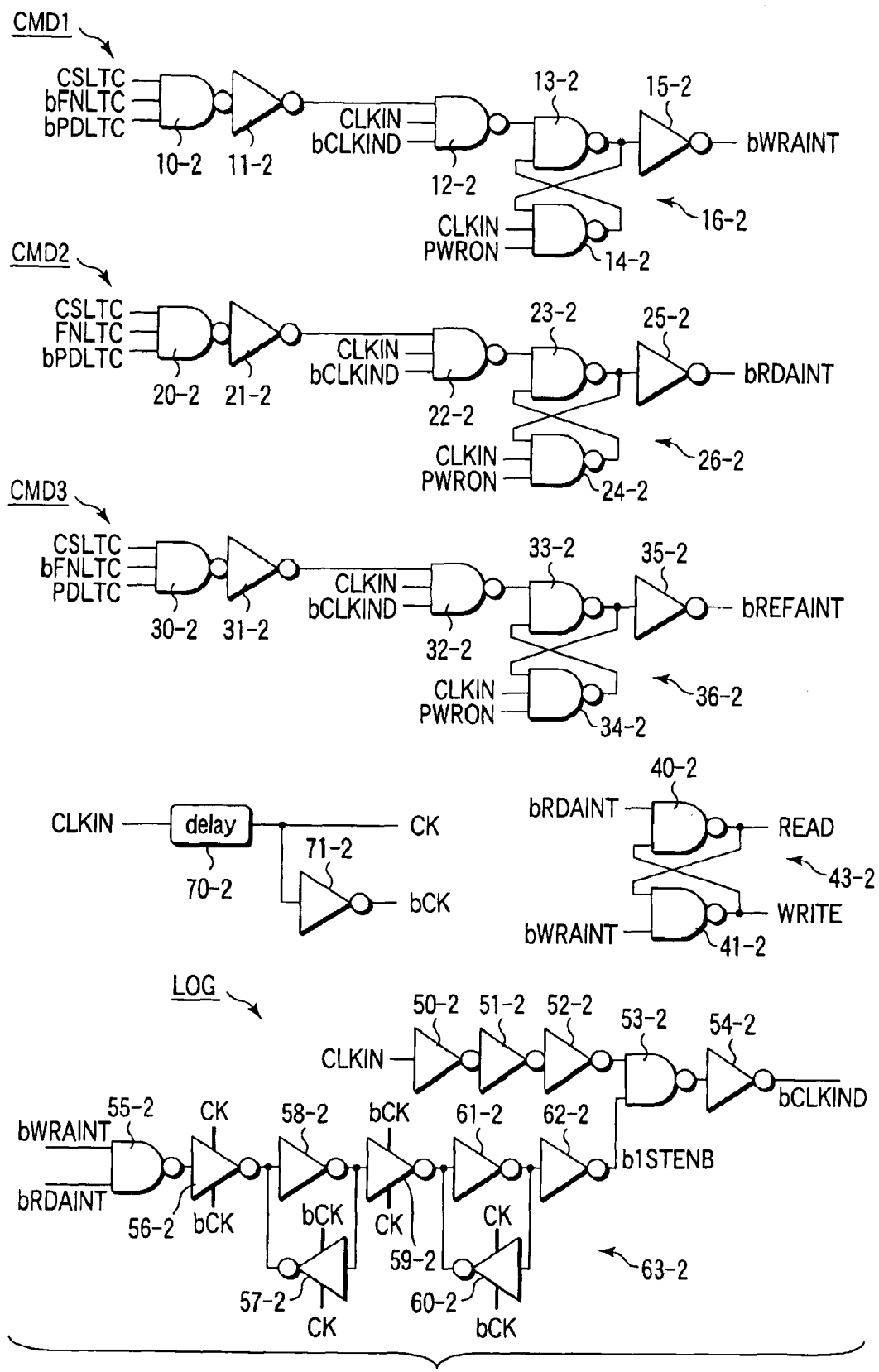
FIG. 11 is a circuit diagram showing a first command determination circuit (first command decoder) which determines a first command, for illustrating the synchronous semiconductor memory device according to the embodiment of the present invention and the operating method thereof.

FIG. 11 shows a first command determination circuit (first command decoder) which determines a first command. Output signals of the external pin logic determination circuit shown in FIG. 10 are input to the command determination circuit which in turn outputs internal command determination signals. For example, a command determination circuit CMD1 which determines a write active command WRA includes NAND gates 10-2, 12-2, 13-2, 14-2 and inverters 11-2, 15-2. The internal control signals CSLTC, bFNLTC, bPDLTC of the same logical level as that of the write active command WRA are input to the NAND gate 10-2. The output terminal of the NAND gate 10-2 is connected to the input terminal of the inverter 11-2 and the output terminal of the inverter 11-2 is connected to the first input terminal of the NAND gate 12-2. The internal clock signal CLKIN is input to the second input terminal of the NAND gate 12-2 and a signal bCLKIND is input to the third input terminal thereof.

One input terminal of the NAND gate 13-2 is connected to the output terminal of the NAND gate 12-2 and the other input terminal thereof is connected to the output terminal of the NAND gate 14-2. The output terminal of the NAND gate 13-2 is connected to the first input terminal of the NAND gate 14-2, the internal clock signal CLKIN is supplied to the second input terminal of the NAND gate 14-2 and a signal PWRON is supplied to the third input terminal thereof. The NAND gates 13-2 and 14-2 configure a NAND type flip-flop circuit 16-2. The initialization control operation of the NAND type flip-flop circuit 16-2 is performed by the signal PWRON. The signal PWRON is set at the "L" level immediately after the power supply is turned ON and is set to and kept at the "H" level after it is detected that the potential state in the chip internal portion becomes stable. The input terminal of the inverter 15-2 is connected to the output terminal of the NAND gate 13-2 and a signal bWRAINT indicating that an internal write active command is detected is output from the output terminal of the inverter 15-2.

A command determination circuit CMD2 which determines a read active command RDA includes NAND gates 20-2, 22-2, 23-2, 24-2 and inverters 21-2, 25-2. The configuration of the command determination circuit CMD2 is basically the same as that of the command determination circuit CMD1. The command determination circuit CMD2 is different from the command determination circuit CMD1 in that the internal function signal FNLTC is supplied to the input terminal of the NAND gate 20-2 and a signal bRDAINT indicating that the read active command RDA is detected is output as an output signal of the command determination circuit CMD2.

A command determination circuit CMD3 which determines an auto-refresh command REF includes NAND gates 30-2, 32-2, 33-2, 34-2 and inverters 31-2, 35-2. The configuration of the command determination circuit CMD3 is basically the same as that of each of the command determination circuits CMD1, CMD2. The command determination circuit CMD3 is different from the command determination circuit CMD1, CMD2 in that the signals CSLTC, bFNLTC, PDLTC of the same logical level as that of the auto-refresh command are supplied to the input terminals of the NAND gate 30-2 and a signal (auto-refresh detection signal) bREFAINT indicating that the auto-refresh command REF is detected is output as an output signal of the command determination circuit CMD3.

The signal bWRAINT indicating that the write active command WRA is detected and the signal bRDAINT indicating that the read active command RDA is detected are input to a NAND type flip-flop circuit 43-2 configured by NAND gates 40-2 and 41-2 in response to input of the first command. Signals READ, WRITE respectively informing that the read state is to be started and that the write state is started are output based on the above signals and the signals READ, WRITE are issued as a determination control signal of the second command decoder.

The signal bCLKIND supplied to the input terminals of the NAND gates 12-2, 22-2 and 32-2 of the command determination circuits CMD1, CMD2, CMD3 is generated from a logic circuit LOG. The logic circuit LOG includes inverters 50-2, 51-2, 52-2, 54-2, 58-2, 61-2, 62-2, NAND gates 53-2, 55-2 and clocked inverters 56-2, 57-2, 59-2, 60-2. The internal clock signal CLKIN is input to the logic circuit LOG and supplied to one input terminal of the NAND gate 53-2 via the inverters 50-2, 51-2, 52-2. A signal b1STENB is supplied to the other input terminal of the NAND gate 53-2. The signal b1STENB is formed by use of the NAND gate 55-2, clocked inverters 56-2, 57-2, 59-2, 60-2 and inverters 58-2, 61-2, 62-2. The clocked inverters 56-2, 57-2, 59-2, 60-2 and inverters 58-2, 61-2, 62-2 are combined to configure a shift register 63-2. The states of the signals bWRAINT, bRDAINT are detected by use of the NAND gate 55-2 and the signal b1STENB is transferred via the shift register 63-2.

Signals CK, /CK which control the clocked inverters 56-2, 57-2, 59-2, 60-2 of the shift register 63-2 are formed by use of a delay circuit 70-2 to which the internal clock signal CLKIN is input and an inverter 71-2. An output signal of the delay circuit 70-2 is the signal CK and an output signal of the inverter 71-2 is the signal /CK.

Figure 12:
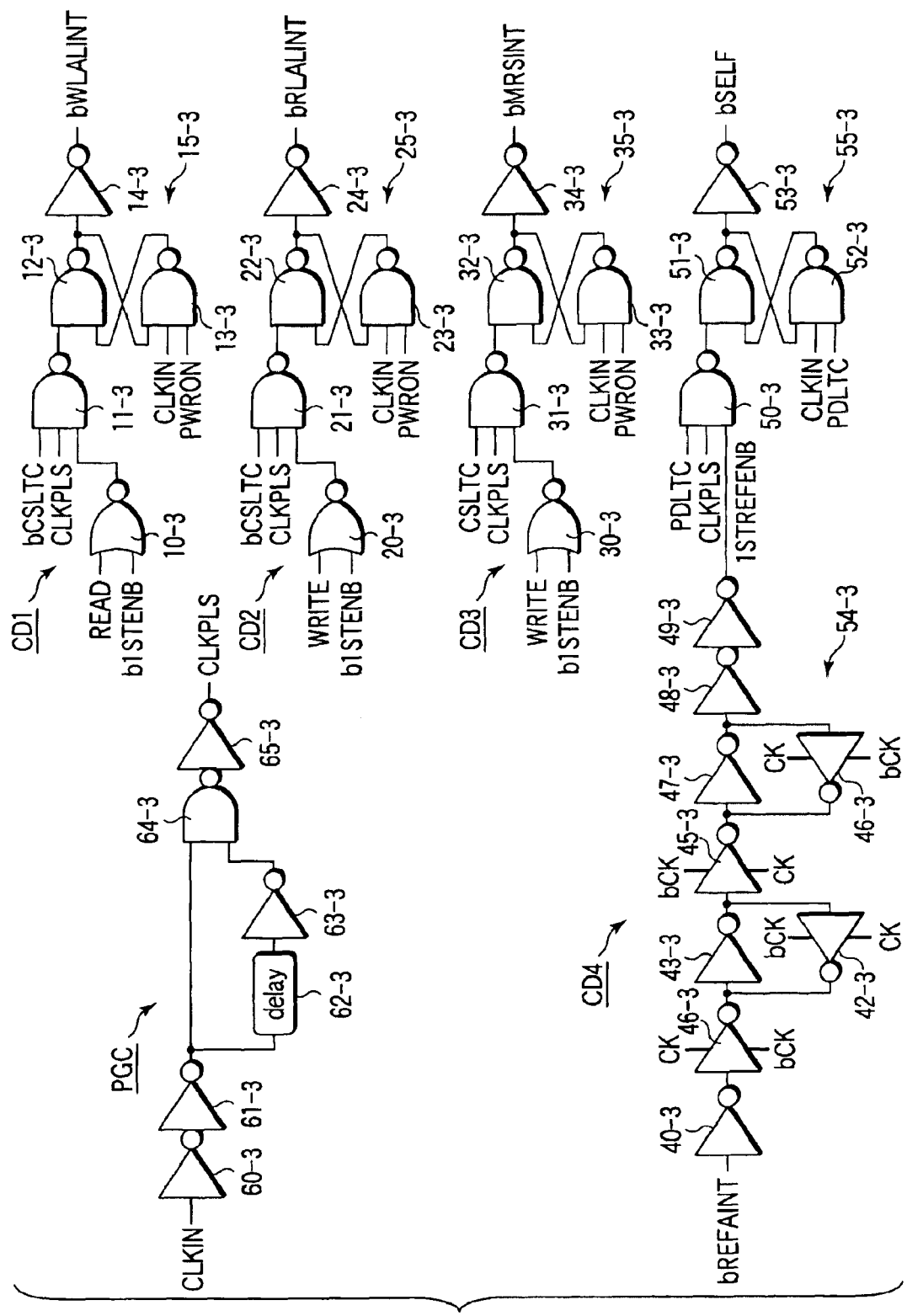
FIG. 12 is a circuit diagram showing a second command decoder, for illustrating the synchronous semiconductor memory device according to the embodiment of the present invention and the operating method thereof.

FIG. 12 shows an example of the configuration of the second command decoder. A decode section CD1 is used to internally detect that the first command is the write active command WRA and the second command is the lower address latch command LAL. The decode section CD1 includes a NOR gate 10-3, NAND gates 11-3, 12-3, 13-3 and inverter 14-3. A signal bCSLTC corresponding to the logical level of the lower address latch command LAL is input to the first input terminal of the NAND gate 11-3. An output signal CLKPLS of a pulse generating circuit PGC is supplied to the second input terminal of the NAND gate 11-3. Further, the third input terminal of the NAND gate 11-3 is connected to the output terminal of the NOR gate 10-3 and the signals READ and b1STENB described in FIG. 10 are input to the input terminals of the NOR gate 10-3.

The NAND gates 12-3, 13-3 configure a NAND type flip-flop circuit 15-3. One input terminal of the NAND gate 12-3 is connected to the output terminal of the NAND gate 11-3 and the other input terminal thereof is connected to the output terminal of the NAND gate 13-3. The first input terminal of the NAND gate 13-3 is connected to the output terminal of the NAND gate 12-3, the second input terminal thereof is supplied with the internal clock signal CLKIN and the third input terminal thereof is supplied with a signal PWRON which initializes the NAND type flip-flop circuit 15-3. The output terminal (the output terminal of the NAND gate 12-3) of the NAND type flip-flop circuit 15-3 is connected to the input terminal of the inverter 14-3 and a command detection signal bWLALINT is output from the output terminal of the inverter 14-3.

A decode section CD2 which internally detects that the first command is the read active command RDA and the second command is the lower address latch command LAL includes a NOR gate 20-3, NAND gates 21-3, 22-3, 23-3 and inverter 24-3. The decode section CD2 is different from the decode section CD1 in that a signal supplied to the input terminal of the NOR gate 20-3 is changed from the signal READ to the signal WRITE.

A decode section CD3 which detects that the first command is the read active command RDA and the second command is the mode register command MRS includes a NOR gate 30-3, NAND gates 31-3, 32-3, 33-3 and inverter 34-3. The decode section CD3 is different from each of the decode sections CD1, CD2 only in that the logical level of the internal chip select signal input to the NAND gate 31-3 is different.

A decode section CD4 which detects that the first command is the auto-refresh command REF and the second command is set to the self-refresh command REF based on the "L" level of the power down pin /PD includes NAND gates 50-3, 51-2, 51-3, inverters 40-3, 43-3, 47-3, 48-3, 49-3, 53-3 and clocked inverters 41-3, 42-3, 45-3, 46-3. A portion configured by the inverters 40-3, 43-3, 47-3, 48-3, 49-3 and clocked inverters 41-3, 42-3, 45-3, 46-3 functions as a holding circuit 54-3 which holds the logical state of the signal bREFAINT indicating that the auto-refresh command is detected in response to the first command described in FIG. 11 in synchronism with the internal clock signal for one clock. The above portion sets a state in which the self-refresh command REF can be accepted in response to the second command. The NAND gates 50-3, 51-3, 52-3 and inverter 53-3 configure a command logic detecting section and an internal power down signal PDLTC, internal clock pulse CLKPLS (output signal of the pulse generating circuit PGC) and a signal 1STREFENB which indicates the state in which the auto-refresh command is accepted in response to the first command are input thereto. When all of the signals PDLTC, CLKPLS, 1STREFENB are set to the "H" level, an output signal of the NAND gate is set to the "L" level. Therefore, an output signal of the NAND gate 51-3 is set to the "H" level by a NAND type flip-flop circuit 55-3 configured by the NAND gates 51-3, 52-3. As a result, an internal signal bSELF indicating that the self-refresh command REF has been accepted is set to the "L" level by the inverter 53-3 and the self-refresh operation is started after the auto-refresh operation accepted in response to the first command is terminated. When the self-refresh operation is released after the second command, the NAND type flip-flop circuit is reset by the internal power down signal PDLTC which is input to the NAND gate 52-3 of the NAND type flip-flop circuit 55-3 since the power down pin /PD is set at the "H" level and then the signal bSELF is returned to the "H" level.

The pulse generating circuit PGC includes inverters 60-3, 61-3, 63-3, 65-3, delay circuit 62-3 and NAND gate 64-3. The pulse generating circuit PGC generates a pulse signal (signal CLKPLS) in synchronism with a leading edge of the internal clock signal CLKIN.

Figure 13:
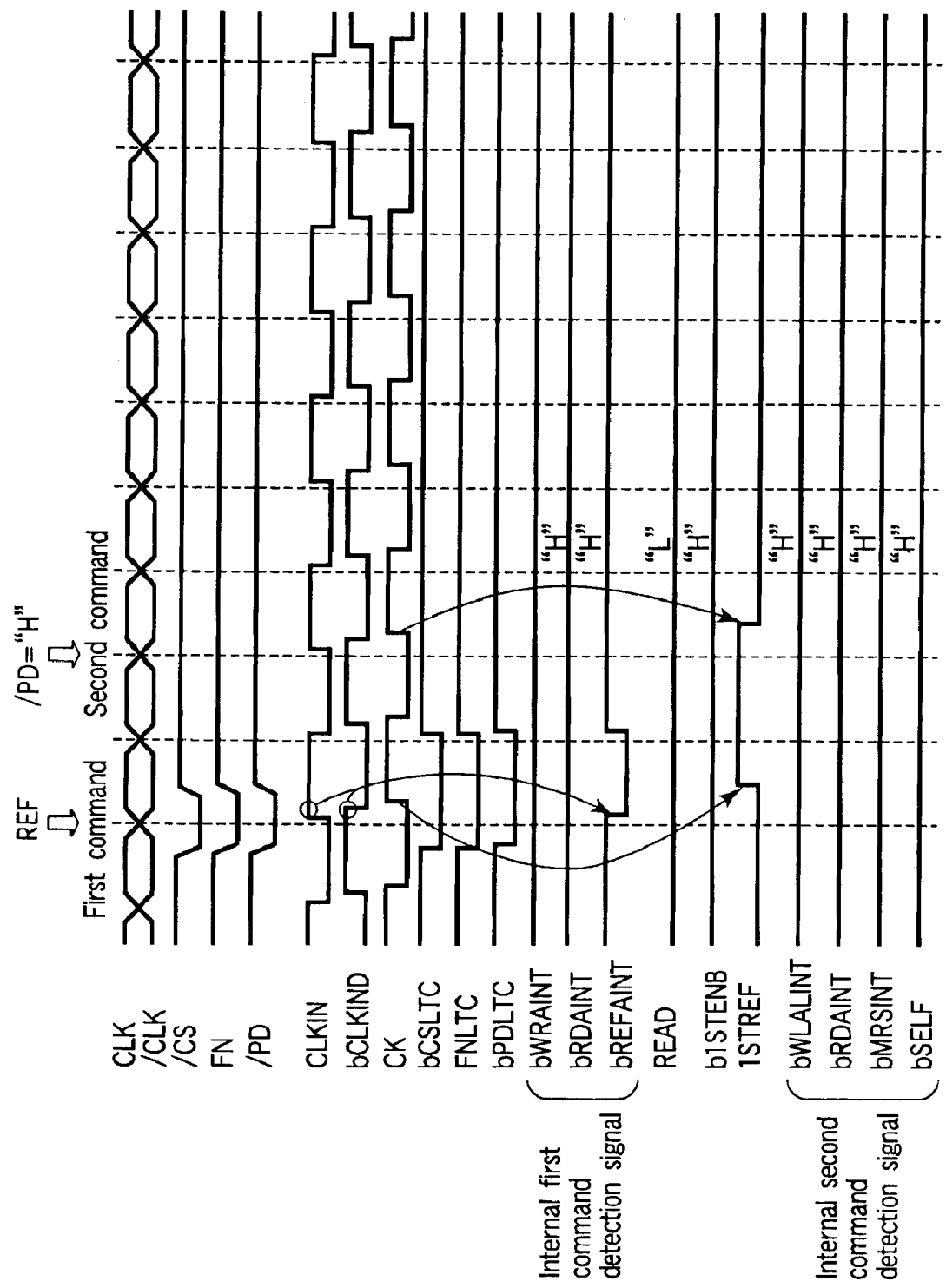
FIG. 13 is a timing chart in a case where entry is made into the auto-refresh command, for illustrating the synchronous semiconductor memory device according to the embodiment of the present invention and the operating method thereof.

Next, the operation of the command decoder for entry into various commands is explained in detail with reference to the timing chart of FIG. 13. FIG. 13 is a timing chart of each command when entry is made into the auto-refresh command REF. As shown in the command table of FIG. 7A, entry into the auto-refresh command REF can be made by setting the chip select pin (chip select signal /CS), function pin (function signal FN) and power down pin (power down signal /PD) to the "L" level in synchronism with the leading edge of the external clock signal. As described with reference to FIG. 10, the levels of the signals input to the input receivers 20-1, 30-1, 40-1 are logically converted according to the logical levels of the above three control pins and internal signals bCSLTC, FNLTC, bPDLTC are output from the latch circuits 25-1, 35-1, 45-1.

Since the signals bCSLTC, FNLTC, bPDLTC input to the NAND gate 30-2 which is an auto-refresh command detection section in the first command decoder shown in FIG. 11 are all set at the "H" level, an output signal of the inverter 31-2 is set at the "H" level. Therefore, an internal clock signal CLKIN input to the NAND gate 32-2 is set to the "H" level in synchronism with the leading edge of the external clock signal. Likewise, a signal bCLKIND input to the NAND gate 32-2 is changed from the "H" level to the "H" level via an odd-stage gate delay circuit formed of the inverters 50-2, 51-2, 52-2, NAND gate 53-2 and inverter 54-2 in synchronism with the leading edge of the external clock signal. In other words, the command state is fetched by the NAND gate 32-2 in synchronism with the leading edge of the external clock signal in a period in which the internal clock signals CLKIN and bCLKIND are both set at the "H" level state and an "L" level signal is output from the NAND gate 32-2. When the output signal of the NAND gate 32-2 is set to the "L" level, the next-stage NAND type flip-flop circuit 36-2 is set and an internal auto-refresh detection signal bREFAINT of "L" level is output from the inverter 35-2.

After this, the internal clock signal CLKIN is set to the "L" level in synchronism with the trailing edge of the external clock signal. Then, the NAND type flip-flop circuit 36-2 is reset and the internal auto-refresh detection signal bREFAINT which is returned from the "L" level to the "H" level is output from the inverter 35-2. That is, the first command decoder decodes one of the write active command WRA, read active command RDA and auto-refresh command REF in synchronism with the external clock signal. In this case, since the auto-refresh command REF is input, only the decode section for the auto-refresh command detects the command to output a negative pulse as the internal auto-refresh detection signal bREFAINT. As a result, the next-stage control circuit starts the auto-refresh operation in response to an edge which transits from the "H" level to the "L" level.

When the first command is the auto-refresh command, the second command is used to determine whether or not the self-refresh command is accepted. The state of the internal auto-refresh signal bREFAINT detected at the input timing of the first command is output as a signal 1STREFENB by use of the one-clock holding circuit 54-3 which performs the control operation to receive or accept the self-refresh command as shown in FIG. 12. Thus, a self-refresh command detectable state can be set by the NAND gate 50-3.

Since the timing chart of FIG. 13 indicates a case wherein the self-refresh command is not accepted, an 37 H" level signal is input as the power down signal /PD at the input timing of the second command. Therefore, the internal power down signal PDLTC is also set to the "L" level according to the above condition and the command state is fetched in a "H" level period of the internal clock pulse CLKPLS generated in synchronism with the external clock signal. As a result, an output signal of the NAND gate 50-3 is set to the "H" level. At this time, an output signal of the NAND gate 52-3 of the NAND type flip-flop circuit 55-3 is also set to the "H" level and the internal self-refresh command detection signal bSELF output via the NAND gate 51-3 and inverter 53-3 is kept in the "H" level state. As a result, the self-refresh command is not accepted and the FCRAM internal portion detects the auto-refresh command accepted in response to the first command to start the auto-refresh operation and the operation state thereof is automatically returned to the standby state after the auto-refresh operation is terminated.

Figure 14:
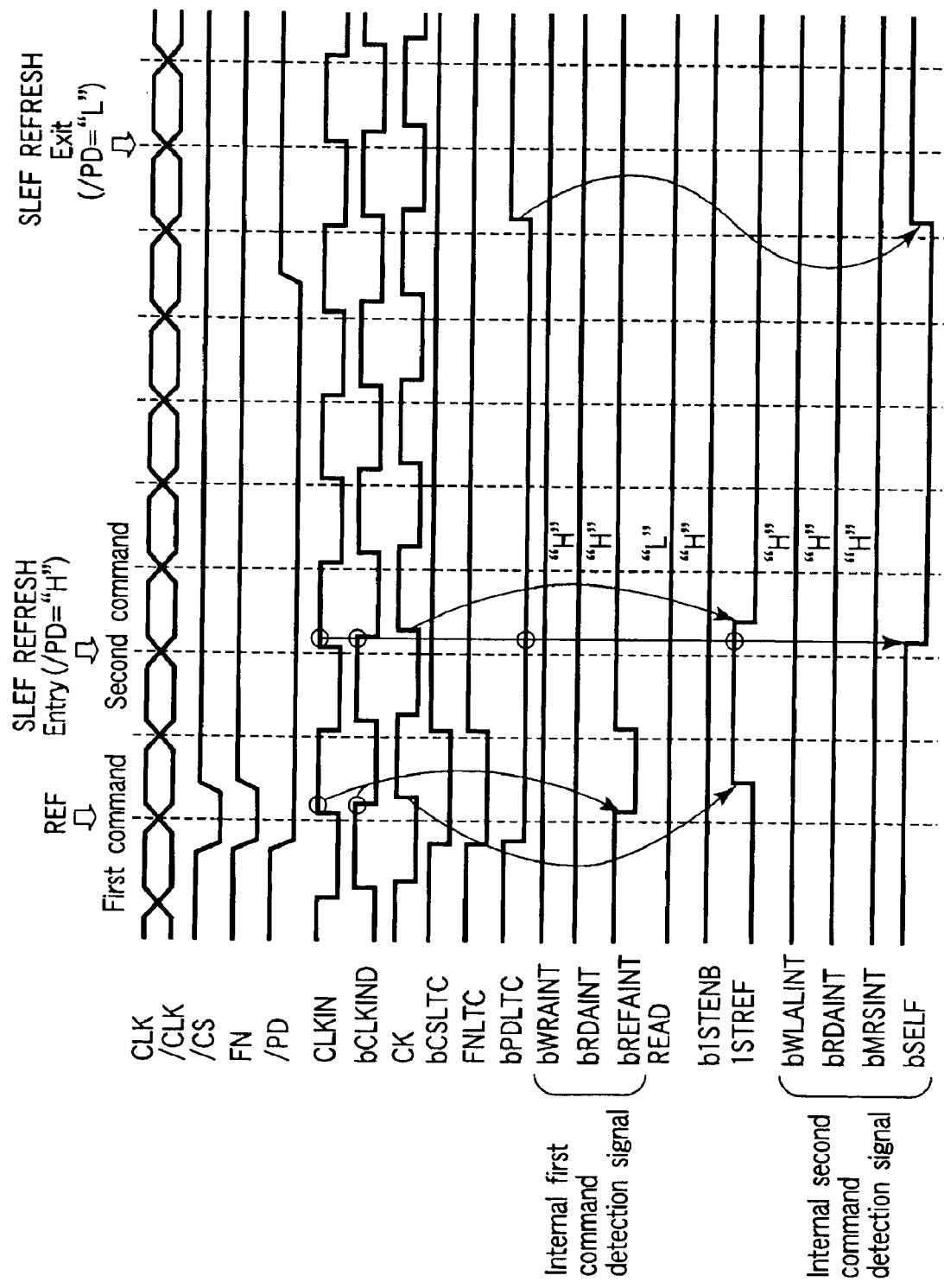
FIG. 14 is a timing chart in a case where entry is made into the self-refresh command, for illustrating the synchronous semiconductor memory device according to the embodiment of the present invention and the operating method thereof.

FIG. 14 is a timing chart of the self-refresh command. If the auto-refresh command of the first command is received and the "L" level of the power down signal /PD is maintained at the input timing of the second command, the self-refresh command is accepted.

As shown in FIG. 12, the internal power down signal PDLTC input to the NAND gate 50-3 is set at the "H" level. Therefore, it is detected that the logical state of the power down signal is set at the "L" level in a period in which the internal clock pulse CLKPLS generated in synchronism with the leading edge of the external clock signal is kept at the "H" level. Then, an output signal of the NAND gate 50-3 is set to the "L" level. The NAND type flip-flop circuit 55-3 is set by an "L" level output signal from the NAND gate 50-3. The "L" level signal is supplied to the inverter 53-3 so as to cause the internal self-refresh signal bSELH to be changed from the "H" level to the "L" level. Then, after the end of the auto-refresh operation, the self-refresh operation is started.

The self-refresh operation is released by setting the power down signal /PD to the "H" level after the second command. The NAND type flip-flop circuit 55-3 is reset by setting the signal PDLTC input to the NAND gate 52-3 to the "L" level to return the signal bSELF to the "H" level and thus the self-refresh operation is terminated.

FIG. 15 is a timing chart of the write operation and read operation. In the case of the write operation, the chip select signal /CS and function signal FN are set to the "L" level and the power down signal /PD is set to the "H" level at the input timing of the first command. As a result, the write active command WRA is detected by the first command decoder shown in FIG. 11 which in turn outputs an internal write active command detection signal bWRAINT. Therefore, the output signals READ and WRITE of the NAND type flip-flop circuit 43-2 are respectively set to the "L" level and "H" level so as to set a second command acceptable state. Then, the state of the output signal bWRAINT, bRDAINT of the first command decoder which is detected according to the write active command WRA or read active command RDA is kept held so as to maintain the signal b1STENB at the "L" level until the second command is detected by use of the shift register 63-2.

Since the input signal READ and the signal b1STENB are both set at the "L" level, the output signal of the NOR gate 10-3 is set to the "H" level and a decodable state can be set by the NAND gate 11-3. When the second command is input, the chip select signal /CS, function signal FN and power down signal /PD are set at the "H" level so as to set the lower address latch command LAL. As a result, the internal signal bCSLTC is set to the "H" level in correspondence to the "H" level of the external chip select signal /CS. An output signal of the NAND gate 11-3 is set to the "L" level by the "H" level of the clock pulse CLKPLS generated in synchronism with the leading edge of the external clock signal. Therefore, the output signal of the next-stage NAND type flop-flop circuit 15-3 is set to the "H" level and an "L" level pulse is output from the inverter 14-3 as the lower address latch detection signal bWRAINT of the internal write operation to control the internal circuit.

Also, in the case of the read operation, the internal signal bRDINT used to detect the read active command RDA which is the first command is generated and an output signal of the NOR gate 20-3 and the internal chip select signal bCSLTC are set to the "H" level in response to input of the second command. As a result, an "L" level pulse is output as the internal detection signal bRDLALINT to control the internal circuit.

As described above, whether the operation is the write operation or the auto-refresh operation can be determined at the input timing of the first command by reexamining the command system to determine the auto-refresh command at the input timing of the first command. As a result, the auto-refresh cycle time can be easily shortened. Further, disturb time due to the auto-refresh cycle time can be shortened and the bus application efficiency can be enhanced.

As described above, according to one aspect of this invention, a synchronous semiconductor memory device and an operating method thereof in which the auto-refresh cycle time can be shortened can be attained.

Further, a synchronous semiconductor memory device and an operating method thereof in which disturb time due to the auto-refresh cycle time can be shortened and the bus application efficiency can be enhanced can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous semiconductor memory device comprising:
a memory cell array having dynamic memory cells arranged in a matrix form; and
a command decoder configured to decode a plurality of commands in synchronism with an external clock signal, the plurality of commands being set by combinations of logical levels of a plurality of control pins at input timing of a first command and at input timing of a second command one cycle after the input timing of the first command, the plurality of control pins including a chip select pin, a function pin and a power down pin, the command decoder including:
a first decode section which determines a read operation;
a second decode section which determines a write operation; and
a third decode section which determines an auto-refresh operation, wherein setting of an auto-refresh command is performed at the input timing of the first command and determined only by a combination of the logical levels of the chip select pin, the function pin and the power down pin at the input timing of the first command.

2. The synchronous semiconductor memory device according to claim 1, wherein setting of a self-refresh command is determined by use of a combination of the logical levels of the chip select pin, the function pin and the power down pin at the input timing of the first command which is the same as the combination used in the case of the auto-refresh command and a combination of the logical levels of the chip select pin, the function pin and the power down pin at the input timing of the second command which is different from the combination used in the case of the auto-refresh command.

3. The synchronous semiconductor memory device according to claim 1, wherein the auto-refresh command is determined by setting the chip select pin, function pin and power down pin to the "L" level at the input timing of the first command.

4. The synchronous semiconductor memory device according to claim 3, wherein the state is automatically returned to a standby state after the auto-refresh operation is terminated in a case where the power down pin is set at the "H" level at the input timing of the second command, and the self-refresh operation is performed after the auto-refresh operation is terminated in a case where the power down pin is set at the "L" level at the input timing of the second command.

5. The synchronous semiconductor memory device according to claim 1, wherein a double data late system in which timing of reading out data from the memory cell array and timing of writing data into the memory cell array are set in synchronism with a leading and trailing edges of the external clock signal is used.

6. The synchronous semiconductor memory device according to claim 1, which further comprises a hold circuit which temporarily holds an address and data and in which a late write system to temporarily hold the address and write data received in a write cycle in the hold circuit and perform a write operation with respect to the memory cell array by use of the address and write data temporarily held in the hold circuit in a next write cycle is used.

7. An operating method of a synchronous semiconductor memory device which includes a memory cell array having dynamic memory cells arranged in a matrix form and is operated in synchronism with an external clock signal and in which a plurality of commands are set by combinations of logical levels of a chip select pin, a function pin and a power down pin at input timing of a first command and at input timing of a second command one cycle after the input timing of the first command, the synchronous semiconductor memory device further including first and second command decoders configured to decode the plurality of commands in synchronism with the external clock signal, wherein the plurality of commands are set by combinations of the chip select pin, the function pin and the power down pin at the input timing of the first command and at the input timing of the second command one cycle after the input timing of the first command, and setting of an auto-refresh command is determined only by a combination of the logical levels of the chip select pin, the function pin and the power down pin at the input timing of the first command, the first command decoder including a first decode section which determines a read operation, a second decode section which determines a write operation, and a third decode section which determines an auto-refresh operation, the second command decoder including a fourth decode section which detects that the first command is a write active command and the second command is a lower address latch command, a fifth decode section which detects that the first command is a read active command and the second command is a lower address latch command, a sixth decode section which detects that the first command is a read active command and the second command is a mode register command, and a seventh decode section which detects that the first command is an auto-refresh command and the second command is a self-refresh command, the operating method comprising:

setting an auto-refresh command by the combination of the logical levels of the chip select pin, the function pin and the power down pin at the input timing of the first command; and setting a self-refresh command by a different combination of the logical levels of the chip select pin, the function pin and the power down pin at the input timing of the second command.

8. The operating method of the synchronous semiconductor memory device according to claim 7 wherein the auto-refresh command is set by setting the chip select pin, function pin and power down pin to the "L" level at the input timing of the first command.

9. The operating method of the synchronous semiconductor memory device according to claim 8, wherein the state is automatically returned to a standby state after an auto-refresh operation is terminated in a case where the power down pin is set at the "H" level at the input timing of the second command, and the self-refresh operation is performed after the auto-refresh operation is terminated in a case where the power down pin is set at the "L" level at the input timing of the second command.

10. The operating method of the synchronous semiconductor memory device according to claim 7, wherein a double data late system in which timing of reading out data from the memory cell array and timing of writing data into the memory cell array are set in synchronism with a leading and trailing edges of the external clock signal is used.

11. The operating method of the synchronous semiconductor device according to claim 7, wherein a late write system in which a write operation is performed to temporarily hold an address and write data received in a write cycle and write data into a memory cell by use of the temporarily held address and write data in a next write cycle is used.

12. The synchronous semiconductor memory device according to claim 1, further comprising an external pin logical determination circuit including:

input receivers which receive respective signals from the chip select pin, the function pin and the power down pin, and logically determine the respective levels of the chip select pin, the function pin and the power down pin; and latch circuits which latch the respective signals received by the input receivers.

13. The synchronous semiconductor memory device according to claim 12, wherein the command decoder receives signals outputted from the latch circuits, the first decode section determines the read operation and outputs a signal indicating detection of an internal read active command, the second decode section determines the write operation and outputs a signal indicating detection of an internal write active command, and the third decode section determines the auto-refresh operation and outputs a signal indicating detection of the auto-refresh command.

* * * * *